US010784348B2

(12) United States Patent
Fanelli et al.

(10) Patent No.: US 10,784,348 B2
(45) Date of Patent: Sep. 22, 2020

(54) POROUS SEMICONDUCTOR HANDLE SUBSTRATE

(71) Applicant: QUALCOMM Incorporated, San Diego, CA (US)

(72) Inventors: Stephen Alan Fanelli, San Marcos, CA (US); Richard Hammond, Gwent (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/669,704

(22) Filed: Aug. 4, 2017

(65) Prior Publication Data

US 2018/0277632 A1 Sep. 27, 2018

Related U.S. Application Data

(60) Provisional application No. 62/475,730, filed on Mar. 23, 2017.

(51) Int. Cl.
*H01L 29/10* (2006.01)
*H01L 23/31* (2006.01)
(Continued)

(52) U.S. Cl.
CPC ...... *H01L 29/1083* (2013.01); *H01L 21/0203* (2013.01); *H01L 21/02532* (2013.01);
(Continued)

(58) Field of Classification Search
CPC ......... H01L 21/02532; H01L 21/02595; H01L 21/2007; H01L 21/30604; H01L 21/6835; H01L 21/76256; H01L 21/84; H01L 29/1083; H01L 29/7803; H01L 23/528; H01L 24/94; H01L 21/02203; H01L 2924/00
(Continued)

(56) References Cited

U.S. PATENT DOCUMENTS 6,306,729 B1 * 10/2001 Sakaguchi .......... H01L 21/2007
257/E21.122
9,570,558 B2 2/2017 Brindle et al.
(Continued)

FOREIGN PATENT DOCUMENTS

FR 2977075 A1 12/2012
WO 2016016532 A1 2/2016
(Continued)

OTHER PUBLICATIONS

International Search Report and Written Opinion—PCT/US2018/016009—ISA/EPO—dated Apr. 26, 2018.
(Continued)

*Primary Examiner* — Patricia D Reddington
(74) *Attorney, Agent, or Firm* — Qualcomm Incorporated

(57) ABSTRACT

An integrated circuit (IC) may include an active device layer on a front-side surface of a semiconductor device substrate. The IC may also include a front-side dielectric layer having a first surface opposite a second surface, the first surface contacting the active device layer. The IC may further include a porous semiconductor handle substrate contacting the second surface of the front-side dielectric layer. The porous semiconductor handle substrate may be uniformly doped.

14 Claims, 14 Drawing Sheets

(51) Int. Cl.
*H01L 21/02* (2006.01)
*H01L 21/78* (2006.01)
*H01L 27/12* (2006.01)
*H01L 21/20* (2006.01)
*H01L 21/306* (2006.01)
*H01L 21/683* (2006.01)
*H01L 21/762* (2006.01)
*H01L 21/84* (2006.01)
*H01L 23/528* (2006.01)
*H01L 23/00* (2006.01)
*H01L 29/78* (2006.01)

(52) U.S. Cl.
CPC .... *H01L 21/02595* (2013.01); *H01L 21/2007* (2013.01); *H01L 21/30604* (2013.01); *H01L 21/6835* (2013.01); *H01L 21/76256* (2013.01); *H01L 21/78* (2013.01); *H01L 21/84* (2013.01); *H01L 23/3114* (2013.01); *H01L 23/528* (2013.01); *H01L 24/94* (2013.01); *H01L 27/1203* (2013.01); *H01L 29/7803* (2013.01); *H01L 21/02203* (2013.01); *H01L 24/11* (2013.01); *H01L 24/13* (2013.01); *H01L 2221/68304* (2013.01); *H01L 2221/68359* (2013.01); *H01L 2224/11* (2013.01); *H01L 2224/13022* (2013.01); *H01L 2924/00* (2013.01); *H01L 2924/00014* (2013.01)

(58) Field of Classification Search
USPC .................................................. 257/338
See application file for complete search history.

(56) References Cited

U.S. PATENT DOCUMENTS

| 9,721,927 | B1* | 8/2017 | Or-Bach | H01L 23/544 |
| 2008/0197447 | A1* | 8/2008 | Halimaoui | H01L 21/76245 |
| | | | | 257/507 |
| 2013/0084689 | A1 | 4/2013 | Arriagada et al. | |
| 2015/0287783 | A1* | 10/2015 | Arriagada | H01L 21/02365 |
| | | | | 438/459 |
| 2016/0079183 | A1* | 3/2016 | Santos Rodriguez | |
| | | | | H01L 23/522 |
| | | | | 257/620 |
| 2017/0033135 | A1* | 2/2017 | Whitefield | H01L 21/6835 |
| 2017/0186890 | A1* | 6/2017 | Balucani | C25D 7/12 |

FOREIGN PATENT DOCUMENTS

| WO | 2016087728 A | 6/2016 |
| WO | 2016149113 A1 | 9/2016 |

OTHER PUBLICATIONS

Steckenreiter V., et al., "Reuse of Substrate Wafers for the Porous Silicon Layer Transfer", IEEE Journal of Photovoltaics, IEEE, US, vol. 6, No. 3, May 1, 2016 (May 1, 2016), pp. 783-790, XP011607178, ISSN: 2156-3381, DOI: 10.1109/JPHOTOV.2016.2545406 [retrieved on Apr. 19, 2016].

* cited by examiner

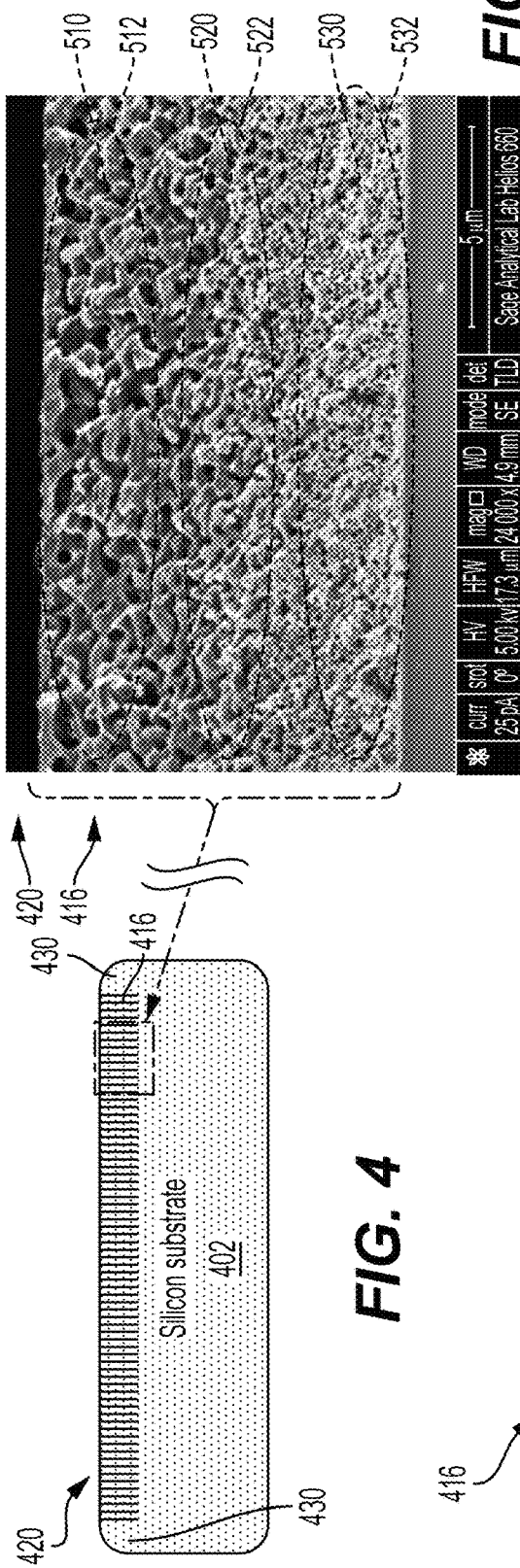
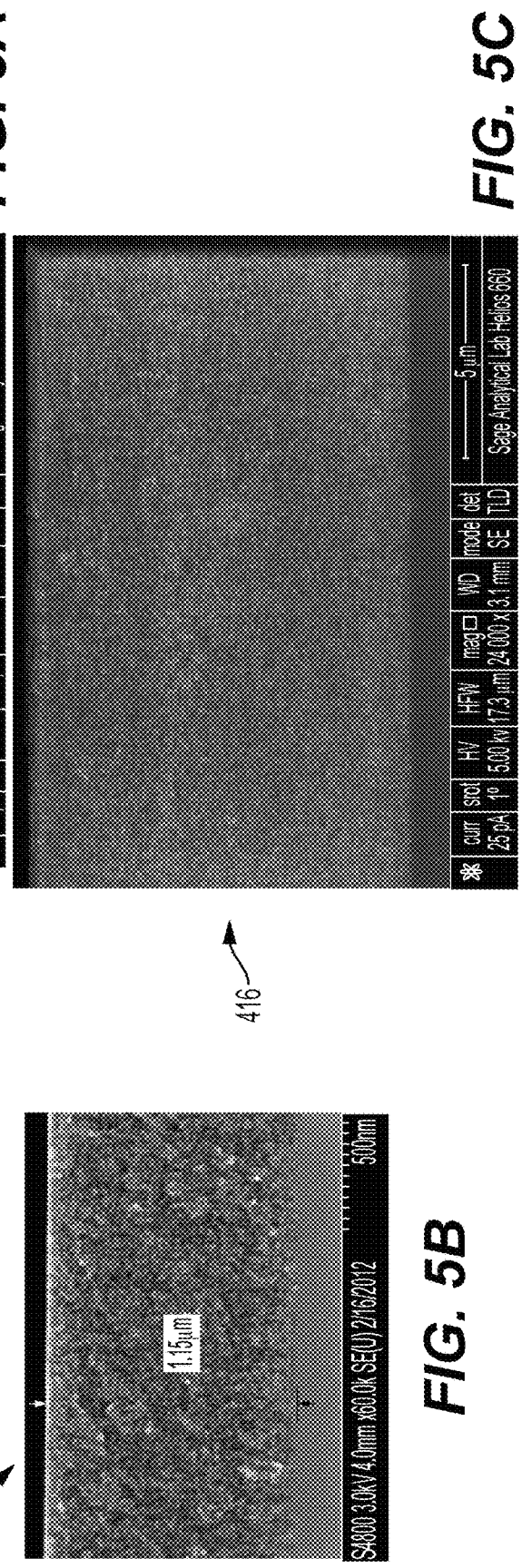
FIG. 5A
FIG. 5C
FIG. 4
FIG. 5B

POROUS SEMICONDUCTOR HANDLE SUBSTRATE

CROSS-REFERENCE TO RELATED APPLICATION

The present application claims the benefit of U.S. Provisional Patent Application No. 62/475,730, filed on Mar. 23, 2017, and titled "POROUS SEMICONDUCTOR HANDLE SUBSTRATE," the disclosure of which is expressly incorporated by reference herein in its entirety.

BACKGROUND

Field

The present disclosure generally relates to integrated circuits (ICs). More specifically, the present disclosure relates to a porous semiconductor handle substrate.

Background

One goal driving the wireless communication industry is providing consumers with increased bandwidth. The use of carrier aggregation in current generation communications provides one possible solution for achieving this goal. Carrier aggregation enables a wireless carrier to increase bandwidth by simultaneously using multiple frequencies for a single communication stream. While an increased amount of data is provided to the end user, carrier aggregation implementation is complicated by noise created at the harmonic frequencies due to the frequencies used for data transmission. For example, 700 MHz transmissions may create harmonics at 2.1 GHz, which interfere with data broadcast at 2 GHz frequencies.

The design complexity of mobile radio frequency (RF) chips (e.g., mobile RF transceivers) is complicated by added circuit functions to support communication enhancements, such as carrier aggregation. The design of these mobile RF transceivers may include the use of silicon on insulator technology. Silicon on insulator (SOI) technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce artificial harmonics caused by the proximity of an active device on the silicon layer and a substrate supporting the BOX layer.

For example, high performance complementary metal oxide semiconductor (CMOS) radio frequency (RF) switch technologies are currently manufactured using SOI substrates. While SOI substrates may provide some protection against artificial harmonics in RF transceivers that support carrier aggregation, there is a need for increasing device isolation and reducing RF loss. For example, a CMOS switch device may be physically bonded to a high resistivity (HR) handle wafer, such as HR-silicon or sapphire. The increased spatial separation of the switch device from the underlying substrate dramatically improves the RF performance of the CMOS switch. Unfortunately the use of SOI wafers and handle substrates is quite expensive relative to the cost of a bulk semiconductor wafer.

SUMMARY

An integrated circuit (IC) may include an active device layer on a front-side surface of a semiconductor device substrate. The IC may also include a front-side dielectric layer having a first surface opposite a second surface, the first surface contacting the active device layer. The IC may further include a porous semiconductor handle substrate contacting the second surface of the front-side dielectric layer. The porous semiconductor handle substrate may be uniformly doped.

A method of fabricating an integrated circuit (IC) may include fabricating an active device layer on a front-side surface of a semiconductor device substrate. The method may also include depositing a front-side dielectric layer on the active device layer. The method may further include bonding a porous semiconductor handle substrate to a first surface of the dielectric layer, in which the first surface is distal from a second surface of the dielectric layer in contact with the active device layer.

An integrated circuit (IC) may include an active device layer on a front-side surface of a semiconductor device substrate. The IC may also include a front-side dielectric layer having a first surface opposite a second surface, the first surface contacting the active device layer. The IC may further include a means for reducing radio frequency (RF) harmonics contacting the second surface of the front-side dielectric layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

FIG. 4 illustrates a cross-sectional view of an integrated circuit (IC) including a porous semiconductor handle substrate according to aspects of the present disclosure.

FIGS. 5A-5C illustrate different porosities of the porous semiconductor handle substrate of FIG. 4 according to aspects of the present disclosure.

DETAILED DESCRIPTION

Figure 1:
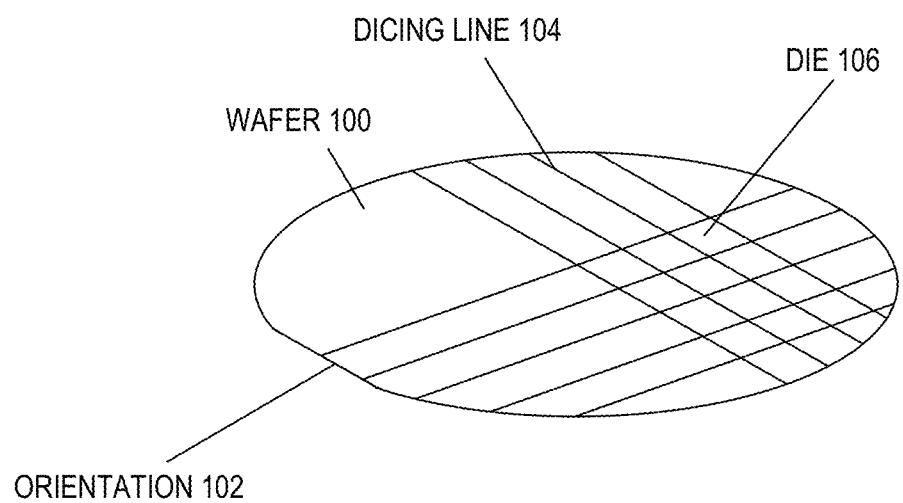
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. While an increased amount of data is provided to the end user, carrier aggregation implementation is complicated by noise created at the harmonic frequencies due to the frequencies used for data transmission.

The design complexity of mobile radio frequency (RF) chips (e.g., mobile RF transceivers) is complicated by added circuit functions to support communication enhancements, such as carrier aggregation. The design of these mobile RF transceivers may include the use of silicon on insulator technology. Silicon on insulator (SOI) technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce artificial harmonics caused by the proximity of an active device on the silicon layer and a substrate supporting the BOX layer.

For example, high performance complementary metal oxide semiconductor (CMOS) radio frequency (RF) switch technologies are currently manufactured using SOI substrates. To increase device isolation and reduce RF losses (e.g., due to artificial harmonics), such switch devices may then be physically bonded to a high resistivity (HR) handle wafer, such as HR-silicon or sapphire. The increased spatial separation of the switch device from the underlying substrate dramatically improves the RF performance of the CMOS switch. Unfortunately the use of SOI wafers including, for example, a trap rich layer, is quite expensive relative to the cost of a bulk semiconductor wafer.

Various aspects of the disclosure provide techniques for forming a trap rich layer (TRL) by creating a porous silicon layer on a top surface of a bulk semiconductor handle wafer. The porous silicon layer reduces harmonics of an RF device and increases linearity significantly relative to current techniques. For example, a circuit may be fabricated on a wafer (e.g., a CMOS wafer), and transferred onto the trap rich porous silicon layer of the handle wafer for improving second and third order harmonics.

Porous silicon is relatively cheap to produce. In particular, porous silicon can be fabricated by introducing a silicon wafer to an electro-chemical etch in dilute hydrofluoric acid. A bulk semiconductor wafer may be subjected to, for example, an electro-chemical etch process to form porous silicon within a surface of the bulk semiconductor wafer. The degree of porosity of the porous silicon may be controlled by a current density, a concentration of the acid, and a duration of the etch. Cost is reduced when porous silicon is formed on the surface of a bulk semiconductor handle wafer that is used in place of a conventional, trap rich silicon handle wafer. A porous semiconductor handle substrate may include high porosity portions corresponding to streets on the semiconductor device substrate. In aspects of the present disclosure, the porous silicon functions as a trap rich layer without having to use a conventional trap rich silicon handle wafer, which is twice the cost of a bulk silicon wafer.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Various aspects of the disclosure provide techniques for creating a trap rich layer (TRL) for radio frequency (RF) integrated circuits. Generally, a porous silicon layer is created on a surface of a bulk semiconductor handle wafer, which replaces a conventional trap rich silicon handle wafer. For example, a bulk semiconductor wafer (e.g., a bulk silicon (Si) wafer) may be subjected to an electro-chemical etch process to form porous silicon within a surface of the bulk semiconductor wafer.

According to aspects of the present disclosure, a bulk semiconductor handle wafer having a porous silicon layer may exhibit a low resistivity. For example, resistivity for a P-type porous silicon handle wafer with no light generation may be anywhere from ~0.001 ohm-cm to ~1 ohm-cm. Similarly, resistivity for an N-type porous silicon handle wafer with no light generation may be anywhere from ~0.01 ohm-cm to ~0.0001 ohm-cm.

A bulk semiconductor handle wafer may be a uniformly doped P-type or N-type substrate, rather than an implanted substrate. An advantage of uniform doping over implanting is that uniform doping results in uniformity of pores in the porous silicon layer (e.g., porous layer). Additionally, the porous silicon layer may have a depth greater than 10 microns. In particular, the depth of the porous silicon layer relates to the effective resistivity of the silicon. In the case of RF signals, the porous silicon layer should be deep enough (e.g., >10 microns) to fully isolate the device while also allowing for application of RF switches.

In one configuration, the doped wafer may be converted to a high resistivity wafer after the porous layer is created. If the porous layer is not deep enough (e.g., <10 microns), and the bulk of the wafer has a resistivity of, for example, ~1.0 ohm-cm, then this would result in a poor insulator. That is, the porous layer would not be an effective trap rich layer because the bulk of the substrate at 1.0 ohm-cm would not act as an insulator. As such, an exemplary depth range for the porous silicon layer may be between 10 microns to 50 microns. Additionally, the bulk semiconductor handle wafer may be porous throughout a majority of its thickness to break up effects from a parasitic resistance channel of an RF circuit.

In some configurations, the porous semiconductor handle substrate may be sealed or capped with oxide (e.g., sealed oxide porous silicon). Alternatively, an oxide may be disposed within the pores. Additionally, the porous semiconductor handle substrate may include different porosities or different levels of porosity in different layers. The layers may be different thicknesses, where different levels of porosity are graded or stepped.

According to an aspect, a sacrificial handle wafer is bonded to a complementary metal-oxide-semiconductor (CMOS) device. A semiconductor handle substrate including a trap rich porous semiconductor layer is then bonded to a second surface of a front-side dielectric layer. The first side may contact an active device layer of a silicon on insulator (SOI) wafer. An oxide and/or adhesive may be provided between the porous semiconductor handle substrate and the front-side dielectric layer.

Advantageously, the porous silicon functions as a trap rich layer without having to use a conventional trap rich silicon handle wafer, which may be twice the cost of a bulk silicon wafer. In one configuration, an integrated circuit device may include an active device layer on a front-side surface of a semiconductor device substrate. The integrated circuit device may further include a front-side dielectric layer having a first surface opposite a second surface, the first surface contacting the active device layer. In this aspect of the present disclosure, the integrated circuit device includes a porous semiconductor handle substrate contacting the second surface of the front-side dielectric layer. The active device layer may include an epitaxially grown silicon layer that is in a range of 150 to 750 angstroms. The handle wafer may be 200 microns, with a 50 micron porous layer, in one configuration.

The porous layer may correspond to areas underneath RF devices, such that the porous layer is not continuous. For example, the porous layer on the handle wafer may include porous and non-porous portions to correspond to areas on the handle wafer underneath RF devices. Additionally, the porous layer may include portions of higher porosity and lower porosity, where the portions of higher porosity may correspond to dicing streets on the handle wafer, which could be used for dicing. For example, the porous handle wafer may be aligned and bonded to the device wafer such that the streets line up. Subsequently, the handle wafer may be subjected to back grinding and then diced using a wet etch, rather than conventional dicing methods, such as sawing or cutting.

FIG. 1 illustrates a perspective view of a wafer. A wafer 100 may be a semiconductor wafer, or may be a substrate material with one or more layers of material on a surface of the wafer 100. The wafer 100 may be a compound material, such as gallium arsenide (GaAs) or gallium nitride (GaN), a ternary material such as indium gallium arsenide (InGaAs), quaternary materials, silicon, quartz, glass, or any material that can be a substrate material. Although many of the materials may be crystalline in nature, polycrystalline or amorphous materials may also be used for the wafer 100. For example, various options for the substrate include a glass substrate, a semiconductor substrate, a core laminate substrate, a coreless substrate, a printed circuit board (PCB) substrate, or other like substrates.

The wafer 100, or layers that are coupled to the wafer 100, may be supplied with materials that enable formation of different types of electronic devices in or on the wafer 100. In addition, the wafer 100 may have an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100, assuming a semiconductor wafer.

Once the wafer 100 has been processed as desired, the wafer 100 is divided up along dicing lines 104. For example, once fabrication of integrated circuits on the wafer 100 is complete, the wafer 100 is divided up along the dicing lines 104, which may be referred to as "dicing streets." The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package. The wafer 100, may be used as a handle substrate including a porous silicon layer, for example, as shown in FIG. 4.

Figure 2:
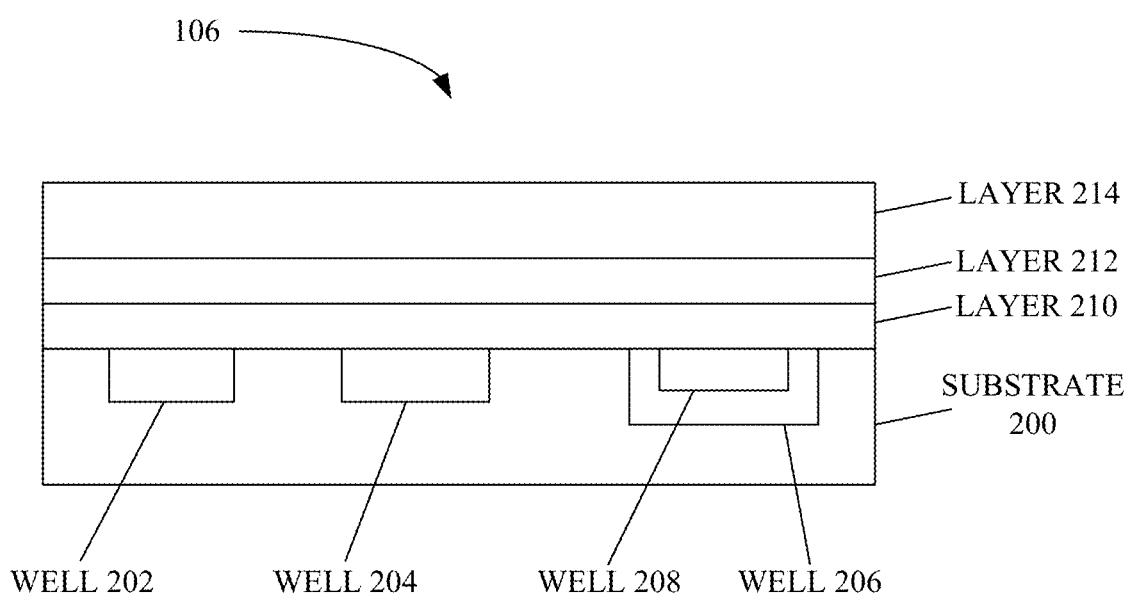
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200. Alternatively, the substrate may be a semi-insulating substrate, including compound semiconductor transistors.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT), a heterojunction bipolar transistor (HBT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Figure 11:
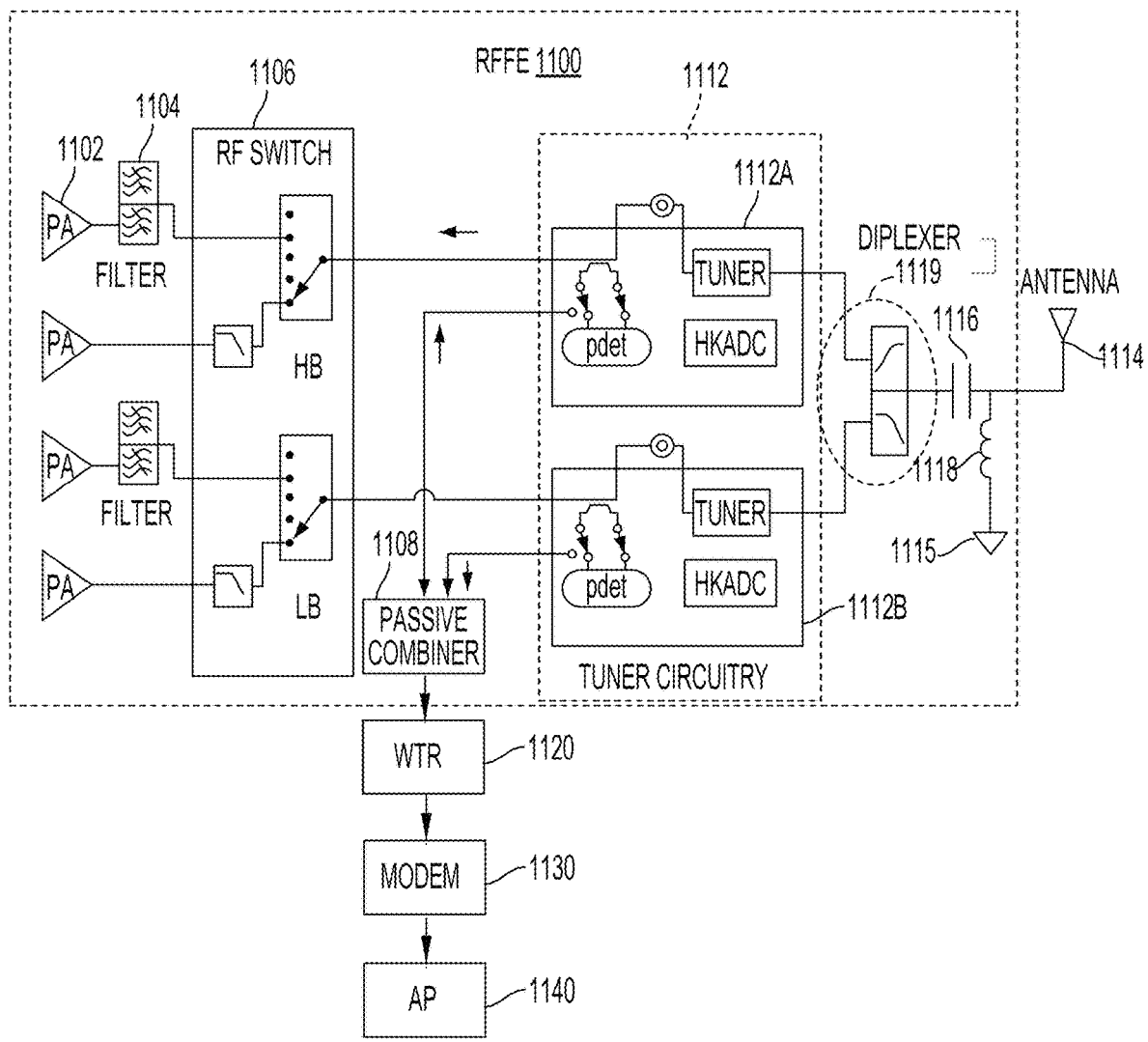
FIG. 11 is a schematic diagram of a radio frequency (RF) front end (RFFE) module employing RF chips having a porous semiconductor handle substrate according to an aspect of the present disclosure.
Figure 12:
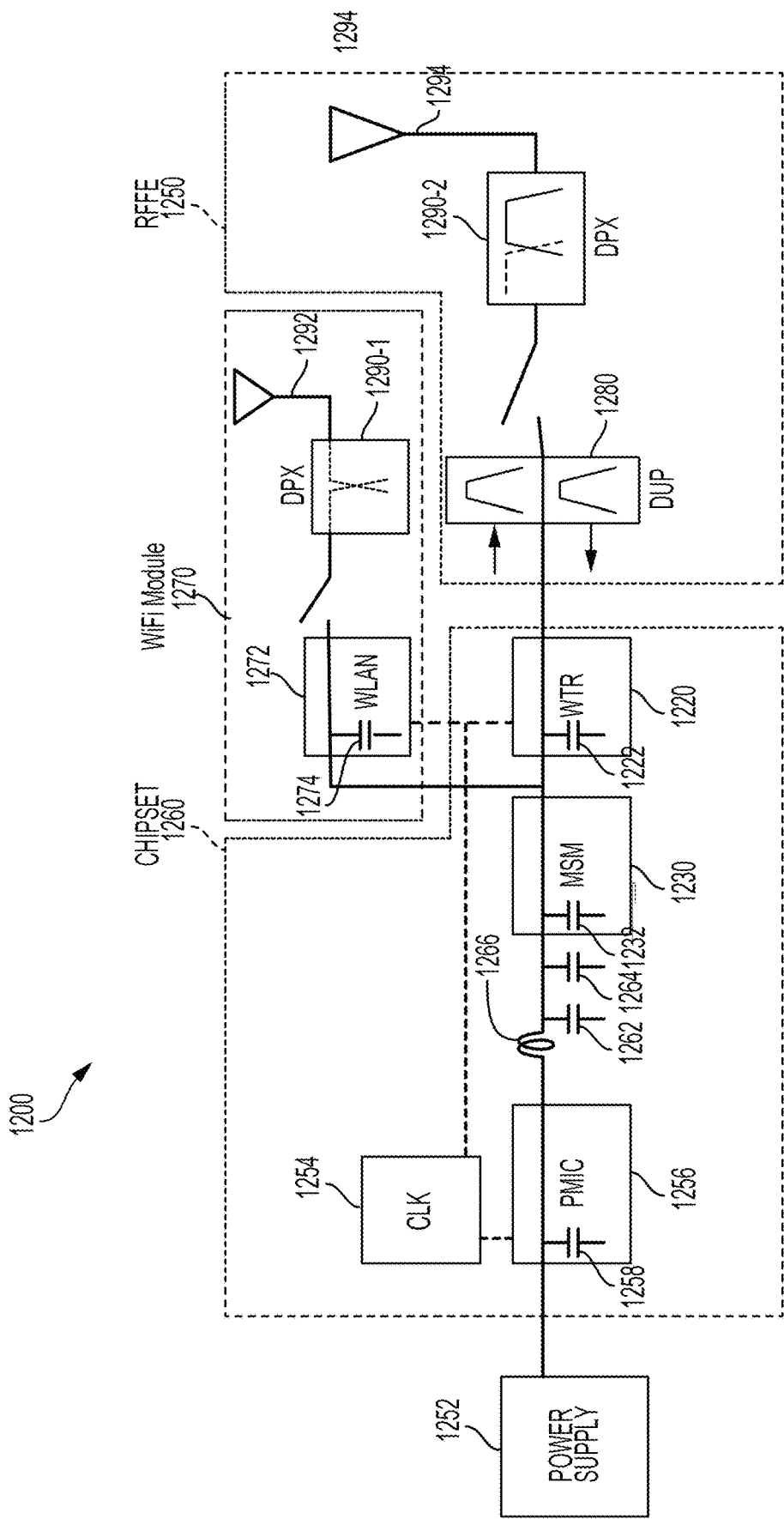
FIG. 12 is a schematic diagram of a WiFi module and a radio frequency (RF) front end (RFFE) module employing RF chips including a porous semiconductor handle substrate for a chipset to provide carrier aggregation according to aspects of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. Aspects of the present disclosure provide RF chips including porous semiconductor handle substrates. These RF chips on the porous semiconductor handle substrates may also include filters, diplexers, a triplexers, low pass filters, and/or a notch filter, or other like circuit elements useful in the formation of radio frequency (RF) front end modules, for example, as shown in FIGS. 11 and 12.

Figure 3A:
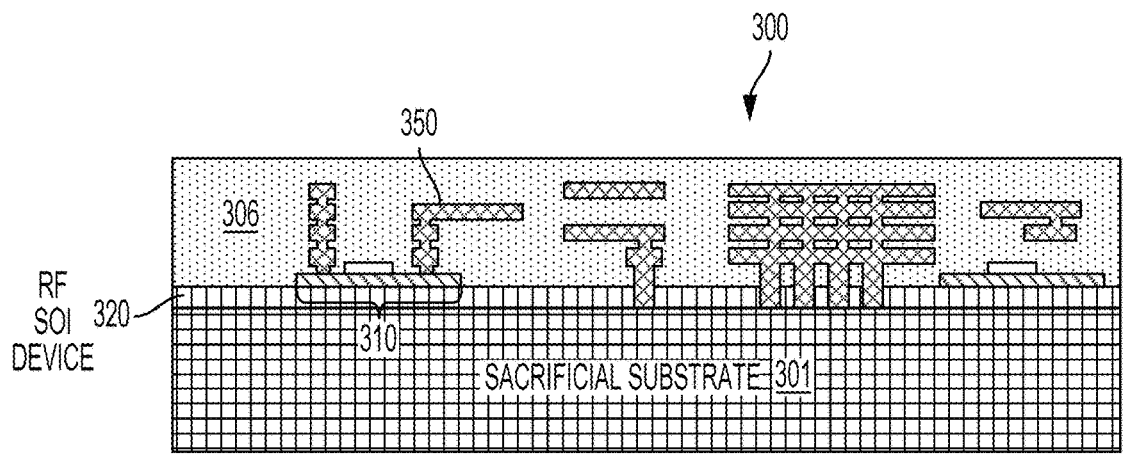
FIGS. 3A to 3E show cross-sectional views of an integrated radio frequency (RF) circuit during a layer transfer process according to aspects of the present disclosure.
Figure 3B:
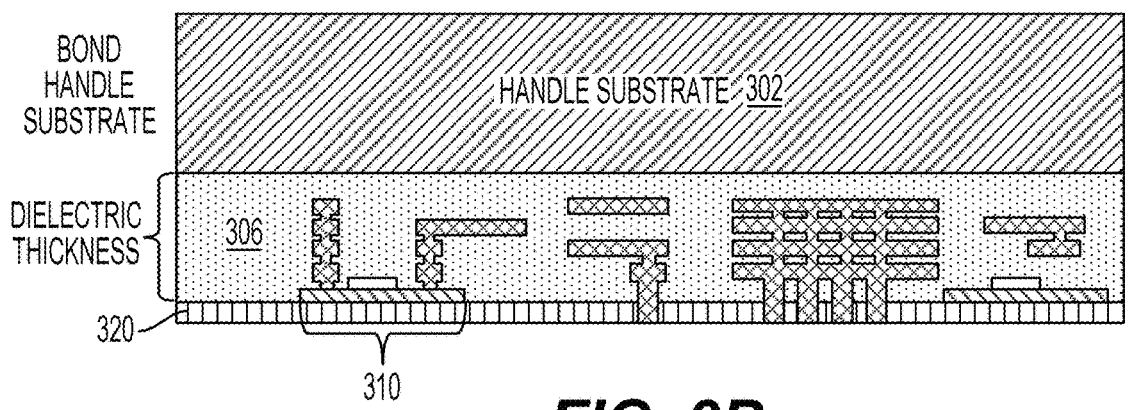

FIGS. 3A to 3E show cross-sectional views of an integrated radio frequency (RF) circuit structure 300 during a layer transfer process. As shown in FIG. 3A, an RF silicon on insulator (SOI) device includes a device 310 on a buried oxide (BOX) layer 320 supported by a sacrificial substrate 301 (e.g., a bulk wafer). The RF SOI device also includes interconnects 350 coupled to the device 310 within a first dielectric layer 306. As shown in FIG. 3B, a handle substrate 302 (such as a porous handle substrate) is bonded to the first dielectric layer 306 of the RF SOI device. In addition, the sacrificial substrate 301 is removed. Removal of the sacrificial substrate 301 using the layer transfer process enables high-performance, low-parasitic RF devices by increasing the dielectric thickness. That is, a parasitic capacitance of the RF SOI device is proportional to the dielectric thickness, which determines the distance between the device 310 and the handle substrate 302.

Figure 3C:
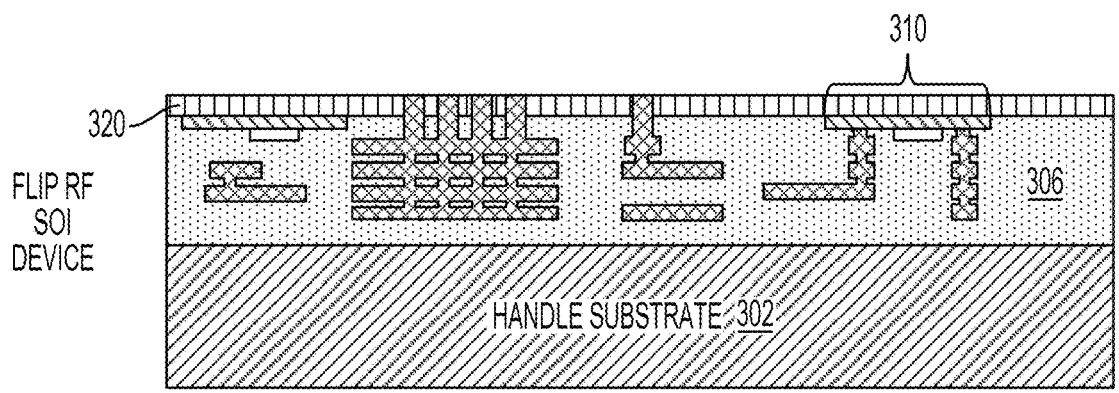
Figure 3D:
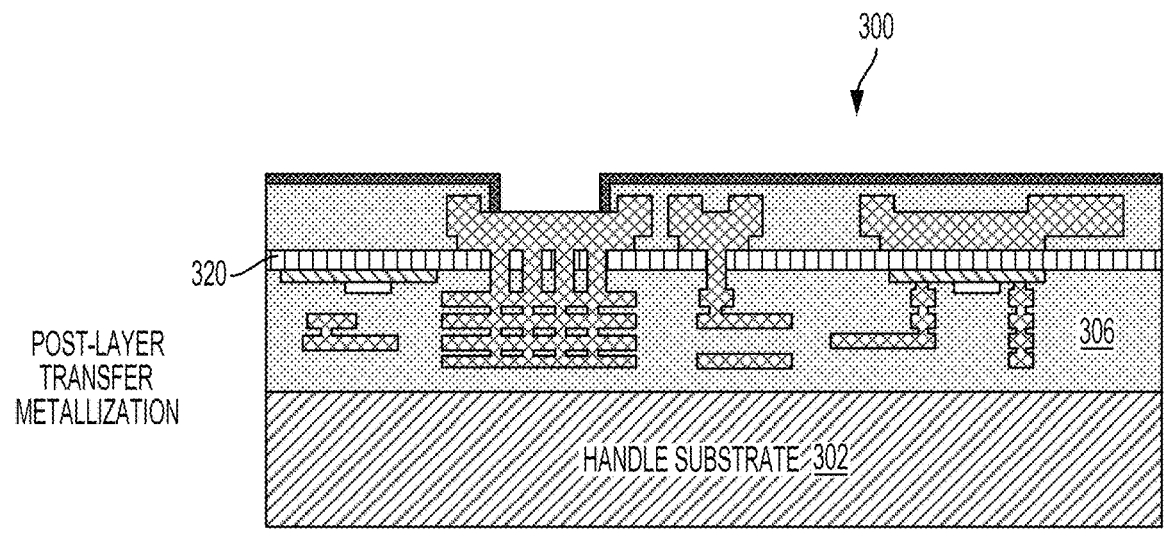
Figure 3E:
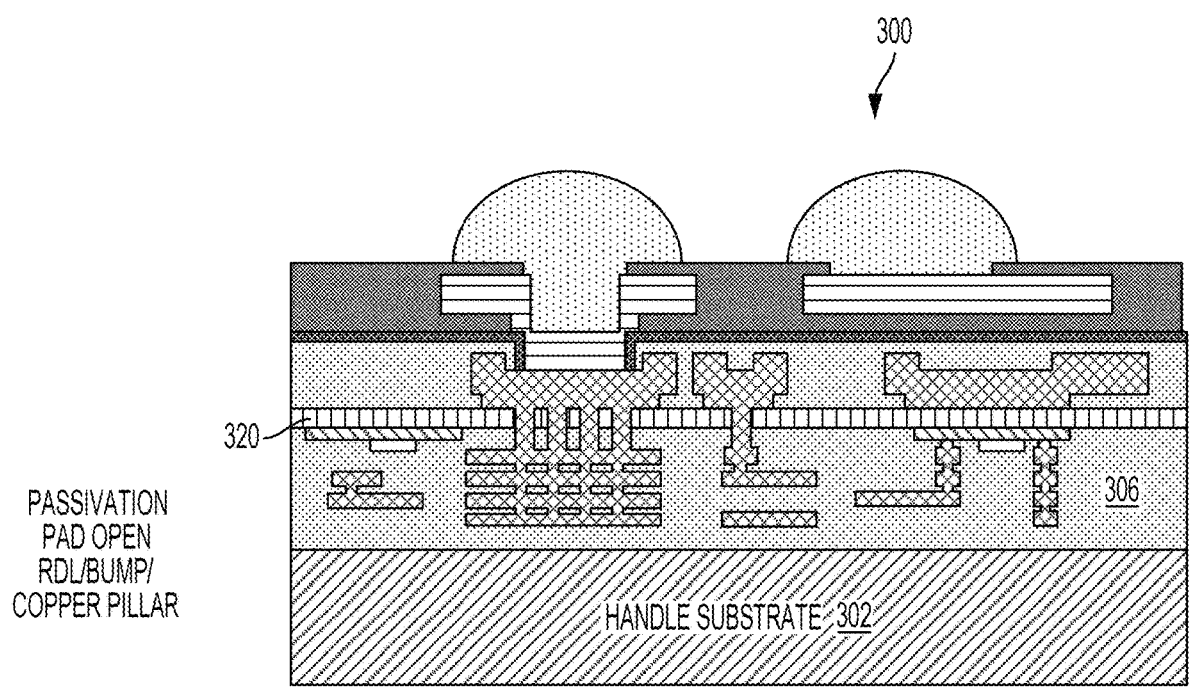

As shown in FIG. 3C, the RF SOI device is flipped once the handle substrate 302 is secured and the sacrificial substrate 301 is removed. As shown in FIG. 3D, a post layer transfer metallization process is performed using, for example, a regular complementary metal oxide semiconductor (CMOS) process. As shown in FIG. 3E, an integrated RF circuit structure 300 is completed by depositing a passivation layer, opening bond pads, depositing a redistribution layer, and forming conductive bumps/pillars to enable bonding of the integrated RF circuit structure 300 to a system board (e.g., a printed circuit board (PCB)). The handle substrate 302, may be composed of a bulk semiconductor substrate, including a porous silicon layer that functions as a trap rich layer, for example, as shown in FIG. 4.

Various aspects of the disclosure provide techniques for fabricating porous semiconductor handle substrates. This fabrication process may be supplemented by a layer transfer and post transfer metallization to provide access to a backside of devices of an integrated radio frequency (RF) integrated structure. By contrast, access to devices, formed during a front-end-of line (FEOL) process, is conventionally provided during a middle-end-of-line (MOL) processing that provides contacts between the gates and source/drain regions of the devices and back-end-of-line (BEOL) interconnect layers (e.g., M1, M2, etc.).

Aspects of the present disclosure reduce harmonics of an RF device by creating a trap rich layer using a porous semiconductor (e.g., silicon (Si)) layer in a bulk semiconductor handle wafer. The porous semiconductor layer reduces harmonics of an RF device and increases linearity significantly relative to current techniques. For example, a circuit may be fabricated on a wafer (e.g., a CMOS wafer), and transferred onto the trap rich layer of the handle substrate for improving second and third order harmonics, for example, as described herein.

FIG. 4 illustrates a porous semiconductor handle substrate 402 according to aspects of the present disclosure. The porous semiconductor handle substrate 402 (e.g., a bulk semiconductor handle wafer or SOI wafer) may include a porous silicon layer 416. The porous silicon layer 416 may be various depths in relation to a thickness of the porous semiconductor handle substrate 402. For example, the porous semiconductor handle substrate may have a thickness of 50 microns, and the porous silicon layer 416 may be 10 microns deep. Of course, various other thicknesses for the porous semiconductor handle substrate 402 and depths of the porous silicon layer 416 are possible. According to various aspects of the present disclosure, the depth of the porous silicon layer 416 may extend either the entire thickness or a partial thickness of the porous semiconductor handle substrate 402.

According to an aspect of the present disclosure, the porous silicon layer 416 may extend downward from a top surface 420 of the porous semiconductor handle substrate 402. For example, during a chemical etch (e.g., electrochemical etch in dilute hydrofluoric acid), the top surface 420 may be etched to create the porous silicon layer 416. Different porosities for the porous silicon layer 416 may be determined by controlling a current density, a concentration of the acid, and a duration of the etch. For example, the porous silicon layer 416 may be 20%-60% porous. Additionally, the porous silicon layer 416 may be 10-50 microns thick, and the porous semiconductor handle substrate 402 may be 200-700 microns thick.

According to aspects of the disclosure, the porous silicon layer 416 may extend across the top surface 420 of the porous semiconductor handle substrate 402 (e.g., full-face). Alternatively, the porous semiconductor handle substrate 402 may include an un-etched portion 430, which may form an outer ring around the circumference of the porous semiconductor handle substrate 402, or may be limited to where a wafer holder contacted the porous semiconductor handle substrate 402 during etching.

According to an aspect of the present disclosure, the top surface 420 may be sealed (e.g., high pressure seal) or capped with oxide (e.g., sealed oxide porous silicon), or the pores may include an oxide within them. This would smooth out the top surface 420 to allow for better bonding to a complementary metal-oxide-semiconductor (CMOS) wafer (e.g., device wafer). According to another aspect of the present disclosure, an adhesive may cover surface pores in addition to providing adhesion to a device wafer.

FIGS. 5A-5C illustrate different porosities of the porous silicon layer 416. For example, the porous semiconductor handle substrate 402 may include different porosities or different levels of porosity in different layers. The layers may be different thicknesses, where different levels of porosity are graded or stepped.

FIG. 5A illustrates a porous silicon layer 416 that is 40% porous. The porosity of the porous silicon layer 416 may include pores of varying sizes, such as including, but not limited to, large pores 510, medium pores 520, and small pores 530.

According to an aspect of the present disclosure, the porous silicon layer 416 may include large pores 510 around a top region 512, medium pores 520 around a middle region 522, and small pores 530 around a bottom region 532 of the porous silicon layer 416. For example, the sizes of the pores may decrease towards the bottom region 532 of the porous silicon layer 416, and may increase towards the top region 512 of the porous silicon layer 416, thus creating different depths with different porosities. This may be due to the chemical etch etching inward from the top surface 420 of the porous semiconductor handle substrate 402. Because the top surface 420 is etched first, and the chemical etch penetrates deeper from the top surface 420, the middle region 522 and the bottom region 532 are affected less, resulting in smaller pores toward the bottom region 532.

FIG. 5B illustrates a porous silicon layer 416 that is 30% porous. The porosity of the porous silicon layer 416 may be more uniform as compared to the 40% porous substrate of FIG. 5A. This may be due to the chemical etch affecting the top surface 420 more evenly at a lower porosity. As the desired porosity increases, the sizes of the pores may vary greater according to their depths in relation to the top surface 420, because the direction of the chemical etch moves inward from the top surface 420.

FIG. 5C illustrates a porous silicon layer 416 that is 20% porous. The porosity of the porous silicon layer 416 may be more uniform as compared to the 30% porous substrate of FIG. 5B. Similar to the above for FIG. 5B, this may be due to the chemical etch affecting the top surface 420 more evenly at a lower porosity. Accordingly, if a more uniform distribution of pores is desired, a lower porosity may be chosen.

According to an aspect of the present disclosure, performance results for higher porosities indicate that higher porosities may be desired as a trap rich layer. As the porosity increases, so does the variation in sizes of pores. Additionally, if the substrate is too porous (e.g., above 80%), the substrate may become brittle.

An advantage of using the porous semiconductor handle substrate 402 as opposed to conventional high resistivity trap rich layer (HR-TRL) substrates, is that the pores create a trap rich layer, while also being relatively inexpensive to manufacture. Performance comparisons between conventional HR-TRL substrates and the porous semiconductor handle substrate 402 show that a 30% porous substrate yields at least a 35 dB improvement.

Figure 6:
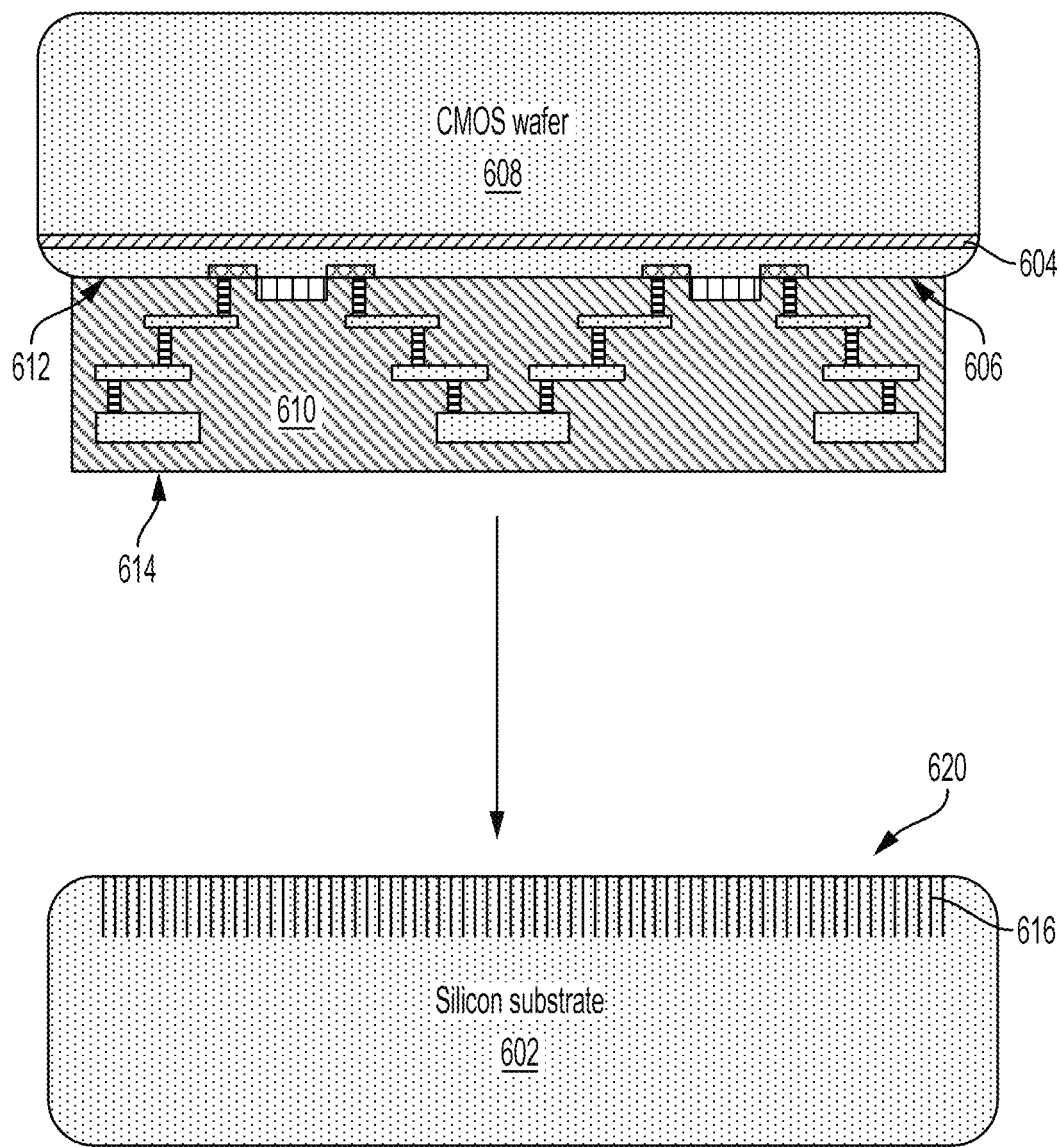
FIG. 6 illustrates bonding of the porous semiconductor handle substrate to a complementary metal-oxide-semiconductor (CMOS) wafer according to aspects of the present disclosure.

FIG. 6 illustrates bonding of a porous semiconductor handle substrate 602 to a complementary metal-oxide-semiconductor (CMOS) wafer 608. For example, the CMOS wafer 608 may include an active device layer 604 on a front-side surface 606 of a semiconductor device substrate (e.g., the CMOS wafer 608). The active device layer 604 may be an epitaxially grown silicon layer that includes active and passive devices such as transistors, resistors, capacitors, inductors, etc. A thickness of the epitaxially grown silicon layer may be in a range of 150 to 750 angstroms. The CMOS wafer 608 may further include a front-side dielectric layer 610 having a first surface 612 opposite a second surface 614. For example, the first surface 612 may contact the active device layer 604 on the front-side surface 606.

According to an aspect of the present disclosure, the porous semiconductor handle substrate 602 may be bonded to the CMOS wafer 608 through the second surface 614 of the front-side dielectric layer 610. The porous semiconductor handle substrate 602 may include a porous silicon layer 616, which creates a trap rich layer (TRL) for radio frequency (RF) ICs. For example, the porous silicon layer 616 may be 10-50 microns thick, be 20%-60% porous, and may be proximate to and/or contact the front-side dielectric layer 610. In one configuration, the porous semiconductor handle substrate 602 may be 200-700 microns thick. Additionally, an oxide and/or adhesive may be between the porous semiconductor handle substrate 602 and the front-side dielectric layer 610 to facilitate bonding.

The porous silicon layer 416 may be etched on a top surface 620 of a bulk semiconductor handle wafer to create the porous semiconductor handle substrate 602, which replaces a conventional trap rich silicon handle wafer. For example, the bulk semiconductor wafer (e.g., a bulk silicon (Si) wafer) may be subjected to an electro-chemical etch process to form porous silicon within a surface of the bulk semiconductor wafer. The degree of porosity of the porous silicon may be controlled by a current density, a concentration of the acid, and a duration of the etch.

According to aspects of the present disclosure, the CMOS wafer 608 may be bonded to the porous semiconductor handle substrate 602 through the layer transfer process described with respect to FIGS. 3A-3E. For example, the active device layer 604 including active and passive devices may be fabricated on the CMOS wafer 608. Subsequently, the active device layer 604 is flip-chip mounted to the porous semiconductor handle substrate 602. Optionally, the CMOS wafer 608 may be removed. Subsequent back end of line (BEOL) processing may then be performed according to the layer transfer process described in FIGS. 3A-3E.

Figure 7:
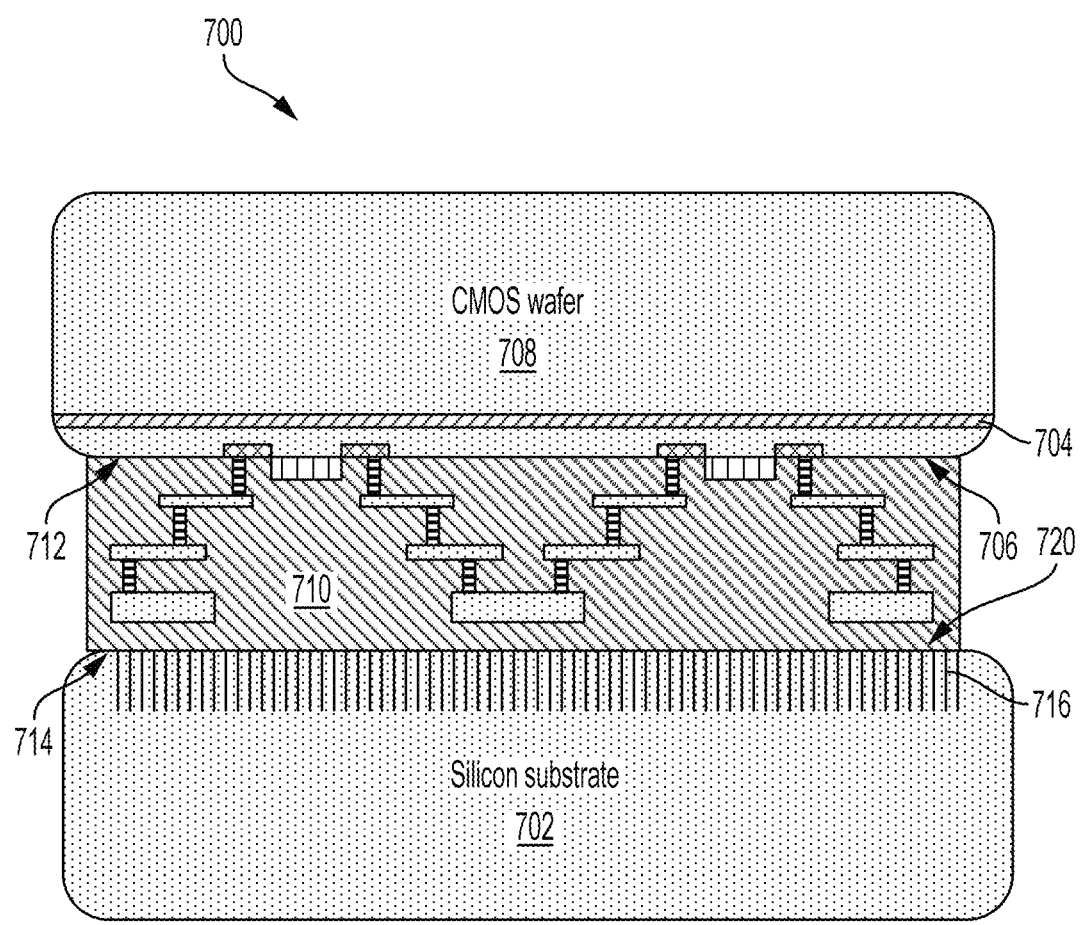
FIG. 7 illustrates a cross-sectional view of an integrated circuit (IC) including a porous semiconductor handle substrate according to aspects of the present disclosure.

FIG. 7 illustrates a cross-sectional view of an integrated circuit (IC) 700 including a porous semiconductor handle substrate 702 according to aspects of the present disclosure.

The IC 700 may include a CMOS wafer 708 bonded to a porous semiconductor handle substrate 702 through a front-side dielectric layer 710. For example, the porous semiconductor handle substrate 702 may contact a second surface 714 of the front-side dielectric layer 710, as described above in FIG. 6. The front-side dielectric layer 710 and the porous semiconductor handle substrate 702 may be bonded through an oxide and/or an adhesive.

An active device layer 704 may be fabricated on a front-side surface 706 of the CMOS wafer 708. The front-side dielectric layer 710 may have a first surface 712 opposite the second surface 714. For example, the first surface 712 may contact the active device layer 704 on the front-side surface 706.

The porous semiconductor handle substrate 702 may include a porous silicon layer 716, which creates a trap rich layer (TRL) for radio frequency (RF) ICs. As described herein, the porous silicon layer 716 may be 10-50 microns thick, be 20%-60% porous, and may be proximate to and/or contact the front-side dielectric layer 710. In one configuration, the porous semiconductor handle substrate 702 may be 200-700 microns thick.

According to aspects of the present disclosure, the porous semiconductor handle substrate 702 may be uniformly doped. For example, the porous semiconductor handle substrate 702 may be a uniformly doped P-type or N-type substrate, rather than an implanted substrate. An advantage of uniform doping over implanting is that uniform doping results in uniformity of pores. The pores may also be mesoporous (e.g., pore diameter between 2 and 20 nm).

Additionally, the porous silicon layer 716 (e.g., porous layer) may have a depth greater than 10 microns. An exemplary depth range for the porous silicon layer 716 may be between 10 microns to 50 microns. The porous semiconductor handle substrate 702 may be porous throughout a majority of its thickness in order to break up effects from a parasitic resistance channel of the RF circuit.

According to aspects of the present disclosure, the porous semiconductor handle substrate 702 may have a low resistivity. For example, resistivity for a P-type porous silicon handle wafer with no light generation may be anywhere from ~0.001 ohm-cm to ~1 ohm-cm, and resistivity for an N-type porous silicon handle wafer with no light generation may be anywhere from ~0.01 ohm-cm to ~0.0001 ohm-cm.

According to aspects of the present disclosure, the porous semiconductor handle substrate 702 may be sealed (e.g. high pressure seal) or capped with oxide (e.g., sealed oxide porous silicon), or the pores may include an oxide within them. Additionally, the porous semiconductor handle substrate 702 may include different porosities or different levels of porosity in different layers. The layers may be different thicknesses, where different levels of porosity are graded or stepped.

Figure 8:
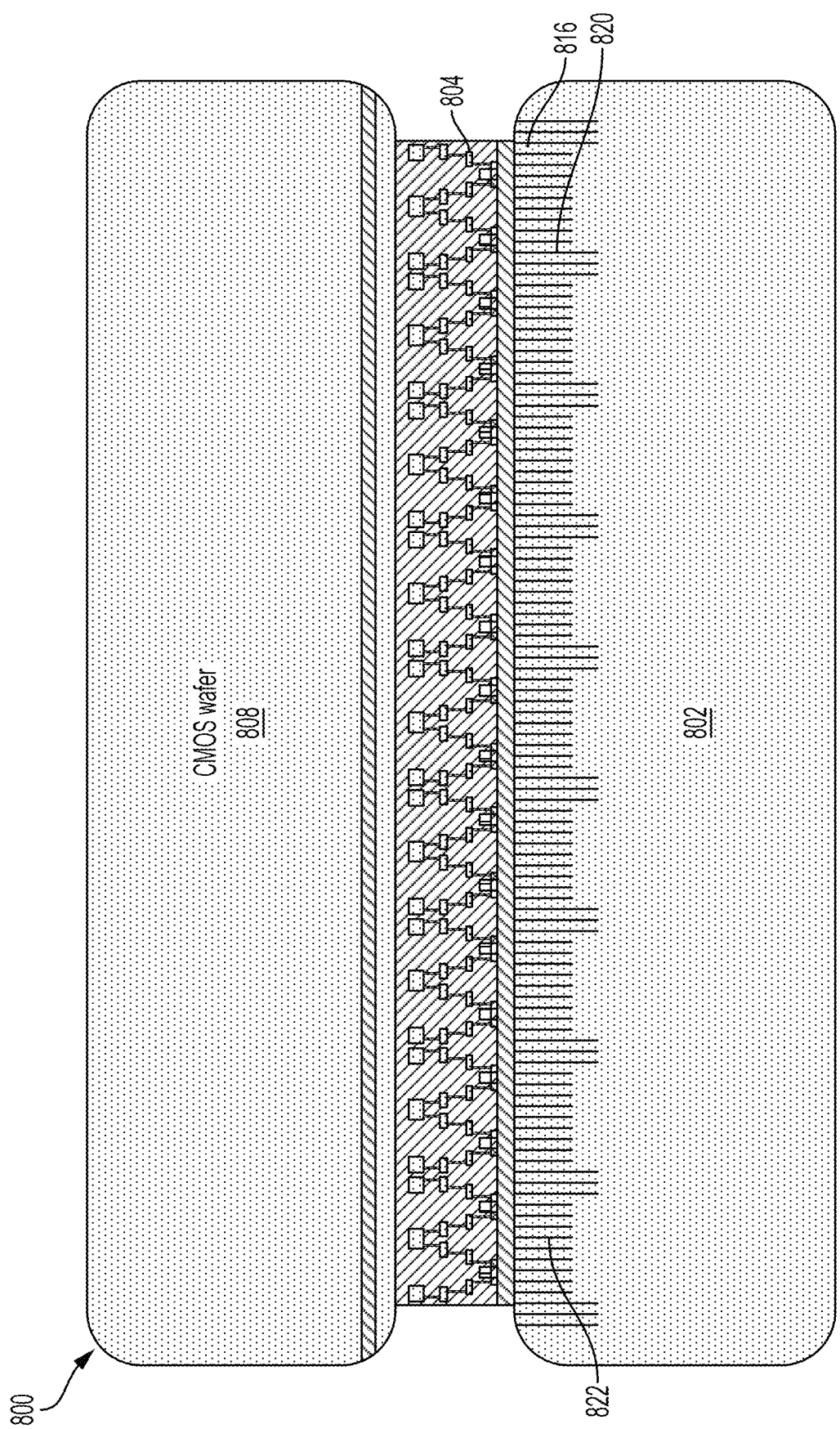
FIG. 8 illustrates a cross-sectional view of an integrated circuit (IC) including a porous semiconductor handle substrate having porous sections corresponding to streets according to aspects of the present disclosure.

FIG. 8 illustrates a cross-sectional view of an integrated circuit (IC) 800 including a porous semiconductor handle substrate 802 having porous sections corresponding to dicing streets according to aspects of the present disclosure.

The porous semiconductor handle substrate 802 may include a porous silicon layer 816 with different porosities corresponding to areas underneath RF devices 804, such that the porous silicon layer 816 is not continuous. For example, the porous silicon layer 816 may include first porosity portions 820 and second porosity portions 822, where the first porosity portions 820 may correspond to dicing streets (not shown) on the porous semiconductor handle substrate 802, which could be used for dicing. The first porosity portions 820 (e.g., above 60% porous) may be more porous than the second porosity portions 822 (e.g., below 60% porous). The porous semiconductor handle substrate 802 may be aligned and bonded to the device wafer 808 such that the streets line up. Back grinding of the porous semiconductor handle substrate 802 to expose the portions of first porosity portions 820, and etching the porous silicon layer 816 would dice the porous semiconductor handle substrate 802 to line up with the streets.

Additionally, in lieu of having low porosity portions, the porous silicon layer 816 on the porous semiconductor handle substrate 802 may include porous and non-porous portions to correspond to areas on the porous semiconductor handle substrate 802 underneath RF devices. For example, the porous portions would line up with the streets of the device wafer 808. Back grinding and etching would subsequently be performed to dice the porous semiconductor handle substrate 802.

According to an aspect of the disclosure, the porous silicon layer 816 may also include porous portions of varying depth. For example, the first porosity portions 820 may include deep porous portions (e.g., ~100 microns) that align with streets to be etched, and the second porosity portions 822 may include shallow porous portions (e.g., ~50 microns) that act as a trap rich layer. The first porosity portions 820 (e.g., above 60% porous) may be more porous than the second porosity portions 822 (e.g., below 60% porous), or they may be equal. Back grinding exposes the deep porous portions, while the shallow porous portions are not exposed. Subsequently, the porous semiconductor handle substrate 802 may be diced using a wet etch, rather than conventional dicing methods, such as sawing or cutting. Alternatively, a porosity of the deep porous portions may be enough to provide a clean break by snapping the porous semiconductor handle substrate 802 along the streets.

Advantages of dicing using portions of the porous silicon layer 816 that line up with streets of a device wafer 808 are that it greatly simplifies the dicing process and reduces costs. The first porosity portions 820 may be aligned with the streets using a mask and an etch. The mask would align the portions to be etched with the streets, and the subsequent etch would create the first porosity portions 820 aligned to the streets.

Figure 9:
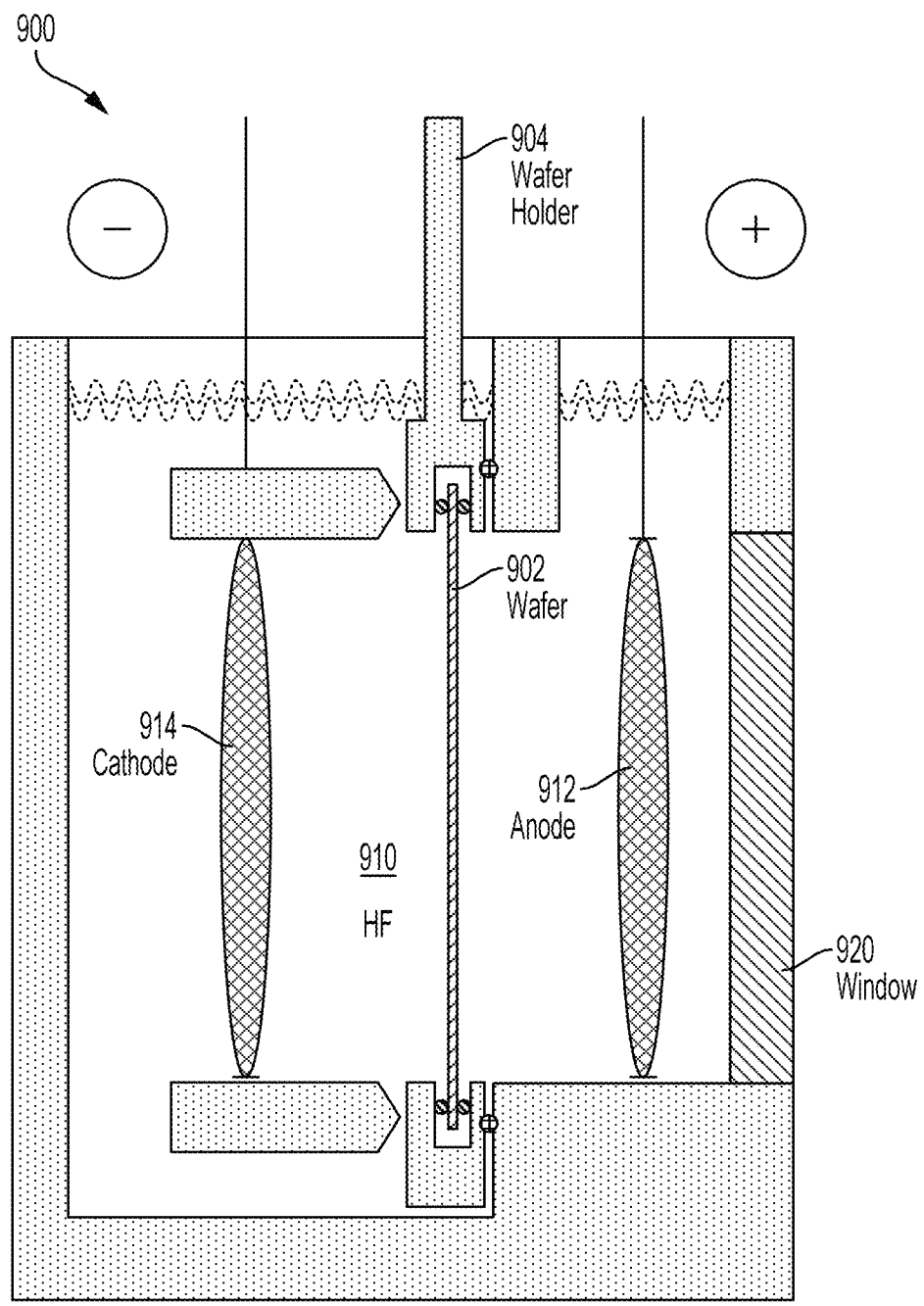
FIG. 9 illustrates an electro-chemical etch process for forming porous silicon according to aspects of the present disclosure.

FIG. 9 illustrates an electro-chemical etch 900 for forming porous silicon according to aspects of the present disclosure. A wafer 902 (e.g. silicon (Si)) to be etched is held in place in a hydrofluoric bath 910 by a wafer holder 904. A current is then applied across the anode 912 and the cathode 914, which causes the wafer 902 to be etched. A window 920 allows the etch process to be observed.

A desired degree of porosity for the wafer 902 may be controlled by varying a current density, a concentration of the acid, and a duration of the etch. The higher the current density, the acid concentration, and the duration, the higher the etch, which results in higher porosity.

According to aspects of the present disclosure, the electro-chemical etch 900 may be modified to only etch a single side of the wafer 902. For example, the wafer holder 904 may include a backing (not shown) to only expose one side of the wafer 902. Additionally, the wafer holder may hold the wafer 902 around its circumference, thus creating an un-etched portion around the circumference of the wafer 902. The wafer holder 904 may otherwise be modified to hold the wafer 902 while covering portions of the wafer 902 not to be etched.

Figure 10:
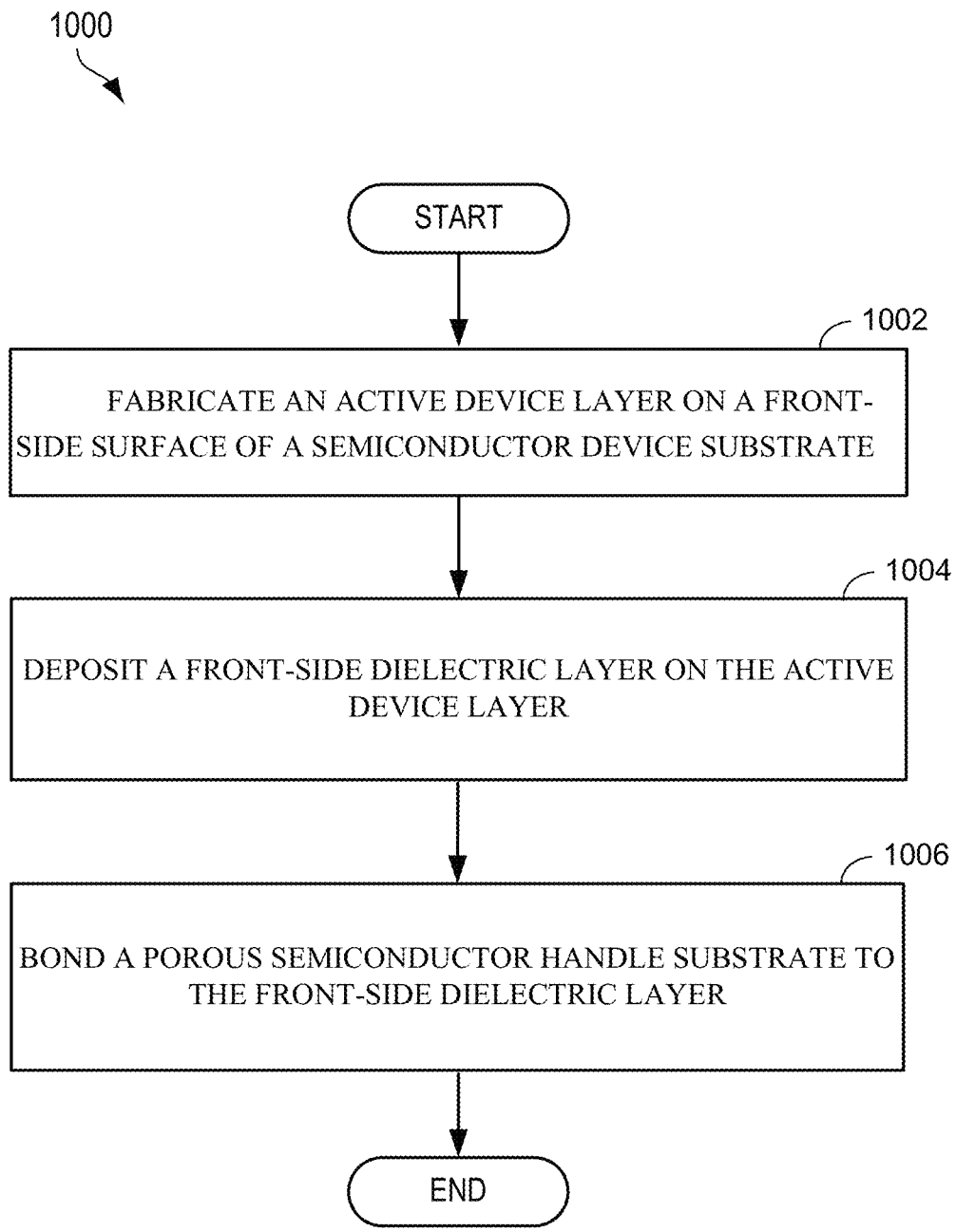
FIG. 10 is a process flow diagram illustrating a method of fabricating an integrated circuit (IC) structure including a porous semiconductor handle substrate according to aspects of the present disclosure.

FIG. 10 is a flow diagram illustrating a method of fabricating an integrated circuit (IC) structure including a porous semiconductor handle substrate, in accordance with aspects of the present disclosure. The blocks in the method 1000 may be performed in or out of the order shown, and in some aspects, can be performed at least in part in parallel.

At block 1002, an active device layer is fabricated on a front-side surface of a semiconductor substrate. For example, as shown in FIG. 6, the active device layer 604 may be formed on the semiconductor device substrate (e.g., the CMOS wafer 608).

At block 1004, a front-side dielectric layer is deposited on the active device layer. At block 1006, a porous semiconductor handle substrate is bonded to the front-side dielectric layer. For example, as shown in FIG. 6, the porous semiconductor handle substrate 602 may be bonded to a second surface 614 of the front-side dielectric layer 610, opposite a first surface 612 of the front-side dielectric layer 610 that contacts the active device layer 604.

In an aspect of the present disclosure, a wafer (e.g., a bulk semiconductor wafer) may be etched to form the porous semiconductor handle substrate 602. For example, a wafer may be electro-chemically etched to form the porous semiconductor handle substrate 602. The porous semiconductor handle substrate 602 may include a porous silicon layer 616. In some examples, a porosity of the porous semiconductor handle substrate 602 may vary (e.g., from 20%-60% porous). For example, a porosity may vary at different layers of depth or surface regions of the porous semiconductor handle substrate 602. Additionally, the porous semiconductor handle substrate 602 may be capped or sealed with oxide.

According to additional aspects of the present disclosure, the porous silicon layer 816 may include high porosity portions (e.g., above 30% porous) corresponding to dicing streets on the porous semiconductor handle substrate 802, as shown in FIG. 8. For example, fabrication of the IC may further include back grinding the porous semiconductor handle substrate 802 to reveal the porous portions, and etching porous portions.

Various aspects of the present disclosure provide techniques for forming a trap rich layer (TRL) by creating a porous silicon layer on a top surface of a bulk semiconductor handle wafer. The porous silicon layer reduces harmonics of an RF device and increases linearity significantly relative to current techniques. For example, a circuit may be fabricated on a wafer (e.g., a CMOS wafer), and transferred onto the trap rich porous silicon layer of the handle wafer for improving second and third order harmonics.

Porous silicon may be cheaply fabricated by introducing a silicon wafer to an electro-chemical etch in dilute hydrofluoric acid. For example, a bulk semiconductor wafer may be subjected to an electro-chemical etch process to form porous silicon within a surface of the bulk semiconductor wafer. The degree of porosity of the porous silicon may be controlled by a current density, a concentration of the acid, and a duration of the etch. Cost may be reduced by forming porous silicon on the surface of a bulk semiconductor handle wafer, rather than a conventional, trap rich silicon handle wafer. A porous semiconductor handle substrate may also include high porosity portions corresponding to streets on the semiconductor device substrate. In aspects of the present disclosure, the porous silicon functions as a trap rich layer without using a conventional trap rich silicon handle wafer, which is twice the cost of a bulk silicon wafer.

According to a further aspect of the present disclosure, an integrated circuit (IC) is described. The IC includes means for reducing radio frequency (RF) harmonics contacting a second surface of a front-side dielectric layer. The means for reducing RF harmonics may, for example, include a porous semiconductor handle substrate 602, as shown in FIG. 6. In another aspect, the aforementioned means may be any layer, module, or any apparatus configured to perform the functions recited by the aforementioned means.

FIG. 11 is a schematic diagram of a radio frequency (RF) front end (RFFE) module 1100 employing RF chips including porous semiconductor handle substrates according to an aspect of the present disclosure. The RF front end module 1100 includes power amplifiers 1102, duplexer/filters 1104, and a radio frequency (RF) switch module 1106. The power amplifiers 1102 amplify signal(s) to a certain power level for transmission. The duplexer/filters 1104 filter the input/output signals according to a variety of different parameters, including frequency, insertion loss, rejection or other like parameters. In addition, the RF switch module 1106 may select certain portions of the input signals to pass on to the rest of the RF front end module 1100.

The RF front end module 1100 also includes tuner circuitry 1112 (e.g., first tuner circuitry 1112A and second tuner circuitry 1112B), a diplexer 1119, a capacitor 1116, an inductor 1118, a ground terminal 1115 and an antenna 1114. The tuner circuitry 1112 (e.g., the first tuner circuitry 1112A and the second tuner circuitry 1112B) includes components such as a tuner, a portable data entry terminal (PDET), and a house keeping analog to digital converter (HKADC). The tuner circuitry 1112 may perform impedance tuning (e.g., a voltage standing wave ratio (VSWR) optimization) for the antenna 1114. The RF front end module 1100 also includes a passive combiner 1108 coupled to a wireless transceiver (WTR) 1120. The passive combiner 1108 combines the detected power from the first tuner circuitry 1112A and the second tuner circuitry 1112B. The wireless transceiver 1120 processes the information from the passive combiner 1108 and provides this information to a modem 1130 (e.g., a mobile station modem (MSM)). The modem 1130 provides a digital signal to an application processor (AP) 1140.

As shown in FIG. 11, the diplexer 1119 is between the tuner component of the tuner circuitry 1112 and the capacitor 1116, the inductor 1118, and the antenna 1114. The diplexer 1119 may be placed between the antenna 1114 and the tuner circuitry 1112 to provide high system performance from the RF front end module 1100 to a chipset including the wireless transceiver 1120, the modem 1130 and the application processor 1140. The diplexer 1119 also performs frequency domain multiplexing on both high band frequencies and low band frequencies. After the diplexer 1119 performs its frequency multiplexing functions on the input signals, the output of the diplexer 1119 is fed to an optional LC (inductor/capacitor) network including the capacitor 1116 and the inductor 1118. The LC network may provide extra impedance matching components for the antenna 1114, when desired. Then a signal with the particular frequency is transmitted or received by the antenna 1114. Although a single capacitor and inductor are shown, multiple components are also contemplated.

FIG. 12 is a schematic diagram 1200 of a WiFi module 1270 including a first diplexer 1290-1 and an RF front end module 1250 including a second diplexer 1290-2 for a chipset 1260 including RF chips having porous semiconductor handle substrates according to aspects of the present disclosure. The WiFi module 1270 includes the first diplexer 1290-1 communicably coupling an antenna 1292 to a wireless local area network module (e.g., WLAN module 1272). The RF front end module 1250 includes the second diplexer 1290-2 communicably coupling an antenna 1294 to the wireless transceiver (WTR) 1220 through a duplexer 1280. The wireless transceiver 1220 and the WLAN module 1272 of the WiFi module 1270 are coupled to a modem (MSM, e.g., baseband modem) 1230 that is powered by a power supply 1252 through a power management integrated circuit (PMIC) 1256. The chipset 1260 also includes capacitors 1262 and 1264, as well as an inductor(s) 1266 to provide signal integrity. The PMIC 1256, the modem 1230, the wireless transceiver 1220, and the WLAN module 1272 each include capacitors (e.g., 1258, 1232, 1222, and 1274) and operate according to a clock 1254. The geometry and arrangement of the various inductor and capacitor components in the chipset 1260 may reduce the electromagnetic coupling between the components.

Figure 13:
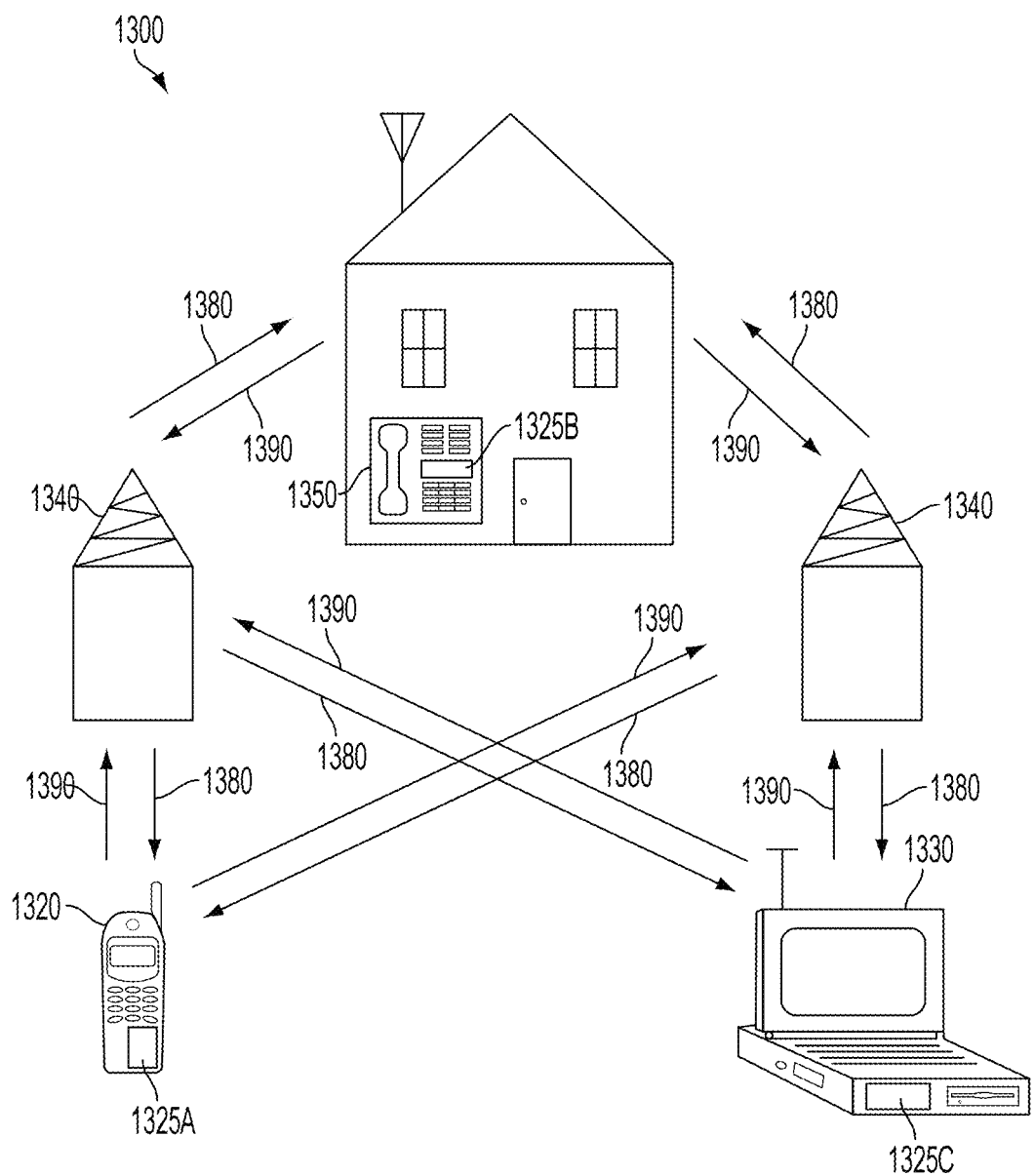
FIG. 13 is a block diagram showing an exemplary wireless communication system in which a configuration of the disclosure may be advantageously employed.

FIG. 13 is a block diagram showing an exemplary wireless communication system 1300 in which an aspect of the disclosure may be advantageously employed. For purposes of illustration, FIG. 13 shows three remote units 1320, 1330, and 1350 and two base stations 1340. It will be recognized that wireless communication systems may have many more remote units and base stations. Remote units 1320, 1330, and 1350 include IC devices 1325A, 1325C, and 1325B that include the disclosed porous semiconductor handle substrates. It will be recognized that other devices may also include the disclosed porous semiconductor handle substrates, such as the base stations, switching devices, and network equipment. FIG. 13 shows forward link signals 1380 from the base station 1340 to the remote units 1320, 1330, and 1350 and reverse link signals 1390 from the remote units 1320, 1330, and 1350 to base stations 1340.

In FIG. 13, remote unit 1320 is shown as a mobile telephone, remote unit 1330 is shown as a portable computer, and remote unit 1350 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 13 illustrates remote units according to the aspects of the disclosure, the disclosure is not limited to these exemplary illustrated units. Aspects of the disclosure may be suitably employed in many devices, which include the disclosed porous semiconductor handle substrates.

Figure 14:
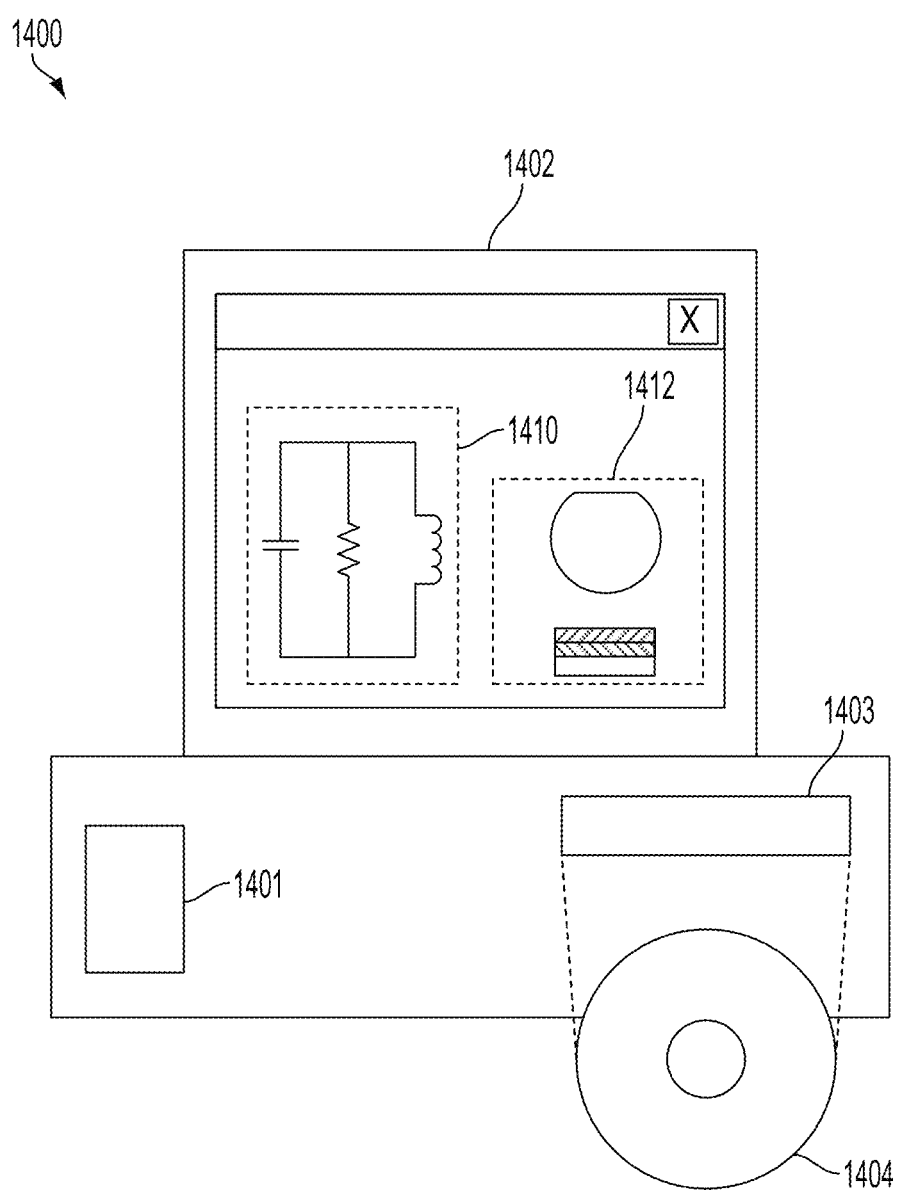
FIG. 14 is a block diagram illustrating a design workstation used for circuit, layout, and logic design of a semiconductor component according to one configuration.

FIG. 14 is a block diagram illustrating a design workstation used for circuit, layout, and logic design of a semiconductor component, such as the porous semiconductor handle substrates disclosed above. A design workstation 1400 includes a hard disk 1401 containing operating system software, support files, and design software such as Cadence or OrCAD. The design workstation 1400 also includes a display 1402 to facilitate a circuit design 1410 or a porous semiconductor handle substrate 1412, such as porous semiconductor handle substrates. A storage medium 1404 is provided for tangibly storing the circuit design 1410 or the porous semiconductor handle substrate 1412. The circuit design 1410 or the porous semiconductor handle substrate 1412 may be stored on the storage medium 1404 in a file format such as GDSII or GERBER. The storage medium 1404 may be a CD-ROM, DVD, hard disk, flash memory, or other appropriate device. Furthermore, the design workstation 1400 includes a drive apparatus 1403 for accepting input from or writing output to the storage medium 1404.

Data recorded on the storage medium 1404 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1404 facilitates the design of the circuit design 1410 or the porous semiconductor handle substrate 1412 by decreasing the number of processes for designing semiconductor wafers.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described herein generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit (IC), comprising:
an active device layer on a front-side surface of a semiconductor layer on an insulator layer of a semiconductor on insulator (SOI) device substrate;
a front-side dielectric layer having a first surface opposite a second surface, the first surface contacting the active device layer; and
a semiconductor handle substrate having a porous semiconductor layer contacting the second surface of the front-side dielectric layer and distal from the SOI device substrate, in which the semiconductor handle substrate is uniformly doped, and the porous semiconductor layer comprises a high porosity portion corresponding to dicing streets on the semiconductor device substrate, a first low porosity portion and a second low porosity portion adjacent to and side-by-side with the high porosity portion, the high porosity portion between the first low porosity portion and the second low porosity portion.

2. The IC of claim 1, in which the porous semiconductor layer has a depth greater than 10 microns.

3. The IC of claim 1, in which the semiconductor handle substrate comprises a bulk silicon wafer having the porous semiconductor layer.

4. The IC of claim 1, in which the porous semiconductor layer is sealed or capped with oxide.

5. The IC of claim 1, further comprising an oxide and/or adhesive between the porous semiconductor layer of the semiconductor handle substrate and the front-side dielectric layer.

6. The IC of claim 1, further comprising an oxide within pores of the porous semiconductor layer of the semiconductor handle substrate.

7. The IC of claim 1, in which the porous semiconductor layer comprises sealed oxide porous silicon.

8. The IC of claim 1, in which the porous semiconductor layer comprises different porosities.

9. The IC of claim 1, in which the porous semiconductor layer comprises different levels of porosity in different layers.

10. The IC of claim 9, in which the different levels of porosity are graded or stepped.

11. The IC of claim 1, in which the porous semiconductor layer comprises a 50 micron thick layer proximate to the front-side dielectric layer.

12. The IC of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

13. An integrated circuit (IC), comprising:
an active device layer on a front-side surface of a semiconductor layer on an insulator layer of a semiconductor on insulator (SOI) device substrate;
a front-side dielectric layer having a first surface opposite a second surface, the first surface contacting the active device layer; and
means for reducing radio frequency (RF) harmonics contacting the second surface of the front-side dielectric layer and distal from the SOI device substrate, and the means for reducing RF harmonics comprising a high porosity portion corresponding to dicing streets on the semiconductor device substrate, a first low porosity portion and a second low porosity portion adjacent to and side-by-side with the high porosity portion, the high porosity portion between the first low porosity portion and the second low porosity portion.

14. The IC of claim 13, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

* * * * *